(12) United States Patent
Utsunomiya

(10) Patent No.: US 10,094,857 B2
(45) Date of Patent: Oct. 9, 2018

(54) CURRENT DETECTION CIRCUIT

(71) Applicant: SII Semiconductor Corporation, Chiba-shi, Chiba (JP)

(72) Inventor: Fumiyasu Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/465,913

(22) Filed: Mar. 22, 2017

(65) Prior Publication Data

US 2017/0276709 A1    Sep. 28, 2017

(30) Foreign Application Priority Data

Mar. 25, 2016  (JP) ................. 2016-062156

(51) Int. Cl.
| | |
|---|---|
| G05F 3/16 | (2006.01) |
| G01R 17/02 | (2006.01) |
| G01R 15/14 | (2006.01) |
| G01R 19/00 | (2006.01) |
| G01R 19/165 | (2006.01) |

(52) U.S. Cl.
CPC .......... *G01R 17/02* (2013.01); *G01R 15/146* (2013.01); *G01R 19/0092* (2013.01); *G01R 19/16519* (2013.01)

(58) Field of Classification Search
CPC ........ G01R 19/16519; G01R 19/16571; G01R 15/146; H02M 2001/0009; G05F 1/573; G05F 3/16; H03K 3/023
See application file for complete search history.

(56) References Cited

U.S. PATENT DOCUMENTS

| | | | |
|---|---|---|---|
| 7,394,635 B2 | 7/2008 | Ikeuchi et al. | |
| 2010/0277142 A1* | 11/2010 | Tan ................. | H02M 7/53803 323/268 |
| 2015/0280558 A1* | 10/2015 | Lopata ............. | H02M 3/158 323/271 |
| 2016/0259360 A1* | 9/2016 | Utsunomiya ....... | G05F 3/262 |

* cited by examiner

*Primary Examiner* — Harry Behm
(74) *Attorney, Agent, or Firm* — Brinks Gilson & Lione

(57) ABSTRACT

To provide a current detection circuit capable of detecting with low current consumption that a prescribed current flows into a current measuring resistor. A current detection circuit is equipped with a reference voltage circuit which has two NMOS transistors having different threshold voltages and a resistor, and generates a reference voltage at the resistor, and a comparison output circuit which is comprised of a PMOS transistor, an NMOS transistor, and a measuring resistor connected in series in a manner similar to a PMOS transistor, an NMOS transistor, and a resistor and outputs a comparison result.

3 Claims, 2 Drawing Sheets ial 206, a reference voltage circuit 20, a voltage com-
CURRENT DETECTION CIRCUIT

RELATED APPLICATIONS

This application claims priority under 35 U.S.C. § 119 to Japanese Patent Application No. 2016-062156 filed on Mar. 25, 2016, the entire content of which is hereby incorporated by reference.

BACKGROUND OF THE INVENTION

Field of the Invention

The present invention relates to a current detection circuit, and particularly to a current detection circuit which detects that a prescribed current flows into a current measuring resistor.

Background Art

A circuit diagram of a related art current detection circuit 200 is illustrated in FIG. 2.

The related art current detection circuit 200 is equipped with a current inflow terminal 203, a reference terminal 202, a current measuring resistor 241, and a current detection part 251.

The current detection part 251 is comprised of a voltage input terminal 204, a reference terminal voltage input terminal 206, a reference voltage circuit 20, a voltage comparison circuit 261, and an output terminal 205.

The current inflow terminal 203 and the reference terminal 202 are connected to each other through the current measuring resistor 241 and further connected to the voltage input terminal 204 and the reference terminal voltage input terminal 206 respectively.

The reference voltage circuit 20 is provided between the reference terminal voltage input terminal 206 and a minus input terminal of the voltage comparison circuit 261 and supplies a reference voltage Vref based on a voltage of the reference terminal voltage input terminal 206 to the minus input terminal of the voltage comparison circuit 261. The voltage input terminal 204 is connected to a plus input terminal of the voltage comparison circuit 261, and the output of the voltage comparison circuit 261 is connected to the output terminal 205.

The relate art current detection circuit 200 configured as described above is operated as follows.

With a measuring current flowing from the current inflow terminal 203 to the reference terminal 202 through the current measuring resistor 241, a voltage generated at one end of the current measuring resistor 241 is inputted to the voltage input terminal 204. This input voltage and the reference voltage Vref are compared by the voltage comparison circuit 261.

Since the voltage of the voltage input terminal 204 exceeds the reference voltage Vref when the measuring current reaches a detection current value, the output of the voltage comparison circuit 261 becomes a high level so that a high-level current detection signal is outputted from the output terminal 205 (refer to, for example, FIG. 2 of Patent Document 1).

[Patent Document 1] Japanese Patent Application Laid-Open No. 2005-241463

In the above-described related art current detection circuit 200, since the voltage comparison circuit 261 is normally configured to include at least a differential amplifier circuit and a buffer circuit, current consumption of the voltage comparison circuit 261 is large.

SUMMARY OF THE INVENTION

A current detection circuit of the present invention is equipped with a reference voltage circuit which has two NMOS transistors having different threshold voltages and a resistor, and generates a reference voltage at the resistor, and a comparison output circuit which is comprised of a PMOS transistor, an NMOS transistor, and a measuring resistor connected in series in a manner similar to a PMOS transistor, an NMOS transistor, and a resistor and outputs a comparison result.

According to the current detection circuit of the present invention, current paths from a power supply terminal to a GND terminal can be less reduced as compared with the related art detection circuit. Therefore, the present current detection circuit is capable of reducing current consumption than that in the related art current detection circuit.

DETAILED DESCRIPTION OF THE PREFERRED EMBODIMENTS

The present embodiment will hereinafter be described with reference to the accompanying drawing.

Figure 1:
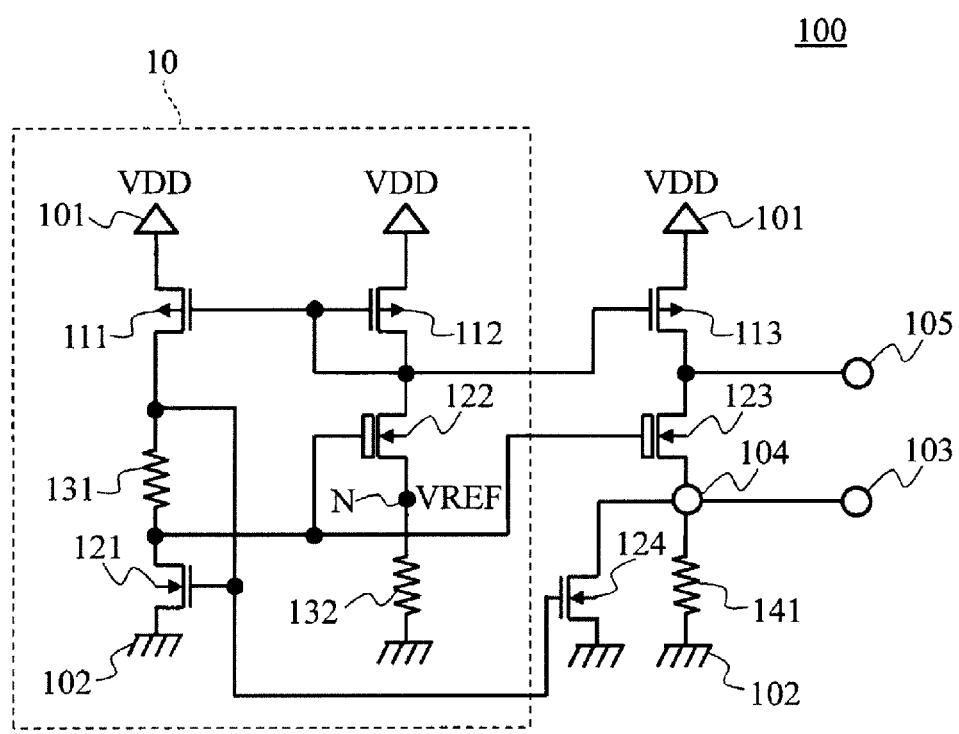
FIG. 1 is a circuit diagram illustrating a current detection circuit according to the present embodiment.
Figure 2:
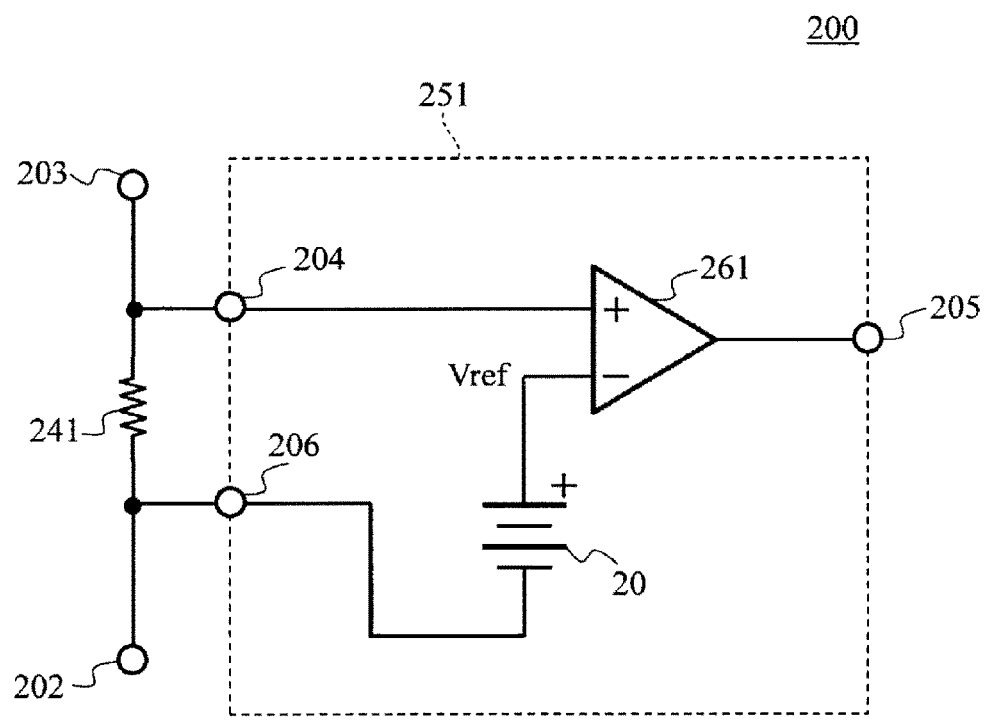
FIG. 2 is a circuit diagram illustrating a related art current detection circuit.

FIG. 1 is a circuit diagram illustrating a current detection circuit 100 according to the present embodiment.

The current detection circuit 100 according to the present embodiment is comprised of a power supply terminal 101, a GND terminal 102, a measuring current input terminal 103, a current measuring resistor connecting terminal 104, an output terminal 105, a PMOS transistor 113, NMOS transistors 123 and 124, a current measuring resistor 141, and a reference voltage circuit 10. The PMOS transistor 113 and the NMOS transistor 123 configure a comparison output circuit.

The power supply terminal 101 is supplied with a plus voltage from a power supply. The GND terminal 102 is supplied with a minus voltage from the power supply.

The reference voltage circuit 10 is configured to include PMOS transistors 111 and 112, NMOS transistors 121 and 122, and resistors 131 and 132.

The PMOS transistors 111, 112 and 113 have gates connected in common and a source commonly connected to the power supply terminal 101. The NMOS transistor 121 has a gate connected to a drain of the PMOS transistor 111, and a source connected to the GND terminal 102. The resistor 131 has one end connected to the drain of the PMOS transistor 111, and the other end connected to a drain of the NMOS transistor 121. The NMOS transistor 122 has a drain connected to a drain of the PMOS transistor 112, and a gate connected to the drain of the NMOS transistor 121. The resistor 132 is connected between a source of the NMOS transistor 122 and the GND terminal 102.

The NMOS transistor 123 has a drain connected to the output terminal 105 and a drain of the PMOS transistor 113, and a gate connected to the gate of the NMOS transistor 122. The current measuring resistor connecting terminal 104 is connected to the measuring current input terminal 103 and a source of the NMOS transistor 123. The current measuring resistor 141 has one end connected to the current measuring resistor connecting terminal 104, and the other end connected to the GND terminal 102. The NMOS transistor 124 has a gate connected to one end of the resistor 131, a drain connected to the current measuring resistor connecting terminal 104, and a source connected to the GND terminal 102.

The NMOS transistors 121 and 124 respectively have a normal threshold voltage. Threshold voltages of the NMOS transistors 122 and 123 are lower than those of the NMOS transistors 121 and 124.

In the reference voltage circuit 10 in the current detection circuit 100 configured as described above, a current flowing through the NMOS transistor 122 low in threshold voltage is copied to a drain current of the PMOS transistor 111 by a current mirror circuit comprised of the PMOS transistor 112 and the PMOS transistor 111. The drain current of the PMOS transistor 111 flows into the NMOS transistor 121 having the normal threshold voltage through the resistor 131.

Now, when the NMOS transistor 122 and the NMOS transistor 121 are made equal to each other in drive capability, and both NMOS transistors are being saturation-operated, overdrive voltages of both NMOS transistors become the same. Therefore, the total value of voltages applied across the resistors 131 and 132 becomes a difference between the threshold voltages of both NMOS transistors. Thus, a reference voltage VREF being a voltage lower than the difference between the threshold voltages of both NMOS transistors can be generated at a connecting point N of the NMOS transistor 122 and the resistor 132.

Incidentally, when the resistance value of the resistor 132 is set lower than that of the resistor 131, the voltage value of the reference voltage VREF can be further lowered.

A current made to flow by applying the reference voltage VREF to the resistor 132 is copied to a drain current of the PMOS transistor 113 through the PMOS transistor 112.

When a drain current made to flow by the NMOS transistor 123 is larger than the drain current of the PMOS transistor 113, the output terminal 105 assumes a voltage at the current measuring resistor connecting terminal 104 and becomes a value close to the voltage of the GND terminal 102. On the other hand, when the drain current made to flow by the NMOS transistor 123 is smaller than that of the PMOS transistor 113, the output terminal 105 assumes the voltage of the power supply terminal 101.

Here, for example, the PMOS transistor 111, the PMOS transistor 112, and the PMOS transistor 113 are set equal to each other in drive capability, the NMOS transistor 122 and the NMOS transistor 123 are set equal to each other in drive capability, and the NMOS transistor 121 and the NMOS transistor 124 are set equal to each other in drive capability.

Thus, when the voltage of the current measuring resistor 141 is lower than the reference voltage VREF, the drain current made to flow by the NMOS transistor 123 becomes larger than the drain current of the PMOS transistor 113, so that a voltage close to the voltage of the GND terminal 102 is outputted from the output terminal 105. When the voltage of the current measuring resistor 141 is higher than the reference voltage VREF, the drain current made to flow by the NMOS transistor 123 becomes smaller than that of the PMOS transistor 113, so that the voltage of the power supply terminal 101 is outputted from the output terminal 105.

Further, the same current as the drain current of the PMOS transistor 113 is copied to the NMOS transistor 124. Therefore, the drain current of the PMOS transistor 113 flows into the NMOS transistor 124 and does not flow into the current measuring resistor 141. Thus, since only the current inputted from the measuring current input terminal 103 flows into the current measuring resistor 141, the influence of an error current other than the measuring current can be eliminated.

According to the current detection circuit 100 of the present embodiment as described above, it is possible to compare the reference voltage VREF and the voltage generated by I-V conversion using the current measuring resistor and detect that a prescribed current flows into the current measuring resistor, without using the voltage comparison circuit requiring many current paths from the power supply terminal to the GND terminal as in the related art current detection circuit. Thus, it is possible to significantly reduce current consumption.

Incidentally, the present embodiment has described that each PMOS transistor and each NMOS transistor are equal to each other in drive capability, but is not limited to it. For example, the ratio of drive capability between the PMOS transistor 112 and the PMOS transistor 113 and the ratio of drive capability between the NMOS transistor 122 and the NMOS transistor 123 may preferably be the same. Also, for example, the current made to flow by the NMOS transistor 124 may preferably be the same as the current made to flow by the PMOS transistor 113.

Further, the resistance value of the resistor 132 may be changed in accordance with a mirror ratio between the PMOS transistor 112 and the PMOS transistor 111.

Further, in the present embodiment, the voltages applied across the resistor 131 and the resistor 132 do not change with respect to the temperature because temperature changes in the threshold voltages of both NMOS transistors are substantially equal to each other. Also, the voltage applied across the resistor 132 does not change with respect to the temperature by forming the resistor 131 and the resistor 132 from the same material. Thus, there is also obtained an effect that the reference voltage VREF with less temperature change can be generated at the connecting point N on the basis of the GND terminal 102.

What is claimed is:

1. A current detection circuit comprising:
a first NMOS transistor;
a second NMOS transistor having a threshold voltage lower than a threshold voltage of the first NMOS transistor;
a reference voltage circuit having a first PMOS transistor and a resistor connected in series with the second NMOS transistor, and generating a reference voltage at the resistor;
a second PMOS transistor, a third NMOS transistor, and a measuring resistor connected in series; and
an output terminal connected to a drain of the second PMOS transistor and to a drain of the third NMOS transistor, and a measuring current input terminal connected to a source of the third NMOS transistor,
wherein a gate of the second PMOS transistor is connected to a gate of the first PMOS transistor, and a gate of the third NMOS transistor is connected to the gate of the second NMOS transistor, and
wherein a result obtained by comparing a voltage generated in the resistor and a voltage generated by a current flowing from the measuring current input terminal to the measuring resistor is output at the output terminal.

2. A current detection circuit comprising:
a power supply terminal;
a GND terminal;
a measuring current input terminal;
an output terminal;
first, second, and third PMOS transistors having gates connected in common and having source regions commonly connected to the power supply terminal;
a first NMOS transistor having a gate connected to a drain of the first PMOS transistor, and a source connected to the GND terminal;

a first resistor having one end connected to the drain of the first PMOS transistor, and the other end connected to a drain of the first NMOS transistor;

a second NMOS transistor having a drain connected to a drain of the second PMOS transistor and a gate connected to the drain of the first NMOS transistor and having a threshold voltage lower than a threshold voltage of the first NMOS transistor;

a second resistor connected between a source of the second NMOS transistor and the GND terminal;

a third NMOS transistor having a drain connected to the output terminal and a drain of the third PMOS transistor, and a gate connected to the gate of the second NMOS transistor and having the same threshold voltage as the threshold voltage of the second NMOS transistor;

a current measuring resistor having one end connected to the measuring current input terminal and a source of the third NMOS transistor, and the other end connected to the GND terminal; and a fourth NMOS transistor having a gate connected to the one end of the first resistor, a drain connected to the one end of the current measuring resistor, and a source connected to the GND terminal.

3. The current detection circuit according to claim 2, wherein a resistance value of the second resistor is lower than the resistance value of the first resistor.

* * * * *